United States Patent
Acklin et al.

(10) Patent No.: US 6,778,576 B1
(45) Date of Patent: Aug. 17, 2004

(54) ENCAPSULATED ILLUMINATION UNIT

(75) Inventors: Bruno Acklin, Regensburg (DE);
Stefan Groetsch, Regensburg (DE);
Helmut Rost, Uttenreuth (DE)

(73) Assignee: Siemens Aktiengesellschaft, München (DE)

( * ) Notice: Subject to any disclaimer, the term of this patent is extended or adjusted under 35 U.S.C. 154(b) by 174 days.

(21) Appl. No.: 09/662,209

(22) Filed: Sep. 14, 2000

(30) Foreign Application Priority Data

Sep. 14, 1999 (DE) .......................................... 199 44 042

(51) Int. Cl.$^7$ .............................. H01S 3/04; H01S 3/00; H01S 5/00; H01S 3/14; H01S 3/08
(52) U.S. Cl. ...................... 372/50; 372/68; 372/38.02; 372/34; 372/101
(58) Field of Search ................................. 372/9, 24, 34, 372/36, 36.02, 43, 50, 68, 70, 73, 101, 103, 108

(56) References Cited

U.S. PATENT DOCUMENTS

| | | | |
|---|---|---|---|
| 3,703,656 A | * 11/1972 | Barnette et al. ............. 313/108 |
| 4,803,689 A | 2/1989 | Shibanuma .................. 372/36 |
| 5,327,443 A | 7/1994 | Tanaka et al. ................ 372/36 |
| 5,446,750 A | 8/1995 | Ohtsuka et al. .............. 372/34 |
| 5,500,540 A | * 3/1996 | Jewell et al. ................. 257/82 |
| 5,689,521 A | 11/1997 | Nakata ........................ 372/50 |
| 5,764,675 A | 6/1998 | Juhala ......................... 372/50 |
| 5,875,205 A | 2/1999 | Spaeth et al. ................. 372/50 |
| 5,902,997 A | 5/1999 | Kropp .......................... 215/216 |
| 5,911,022 A | * 6/1999 | Plickert et al. ................ 385/49 |
| 6,038,242 A | * 3/2000 | Yamamoto et al. ........... 372/34 |
| 6,259,713 B1 | * 7/2001 | Hwu et al. .................... 372/36 |

FOREIGN PATENT DOCUMENTS

| | | |
|---|---|---|
| DE | OS 44 10 888 | 10/1995 |
| DE | OS 196 05 726 | 8/1997 |
| DE | OS 197 06 276 | 8/1998 |
| DE | OS 197 06 279 | 8/1998 |
| DE | OS 198 33 045 | 2/2000 |
| WO | WO 91/02392 | 2/1991 |

* cited by examiner

Primary Examiner—Don Wong
Assistant Examiner—Armando Rodriguez
(74) Attorney, Agent, or Firm—Schiff Hardin LLP

(57) ABSTRACT

Illumination unit for an apparatus, particularly for the implementation of diaphanoscopic examinations at a human, animal or botanical examination subject, has a monolithic semiconductor laser diode bar with driveable laser diodes that emit radiation as well as at least one optical arrangement for collimating and/or focusing the emitted laser radiation. The laser diode bar and the optical arrangement are mounted at a common carrier, and the laser diode bar is connected to pin-like terminal elements at the carrier for diode drive, that are in turn connected or connectable to terminals provided at a carrier plate accepting the carrier. A radiation-transparent covering that encapsulates the carrier.

22 Claims, 2 Drawing Sheets

ENCAPSULATED ILLUMINATION UNIT

FIELD OF THE INVENTION

The present invention is directed to an illumination unit for an apparatus, particularly for applications in the field of medicine, for example for the implementation of diaphanoscopic examinations at a human, animal or botanical examination subject, sensor applications, automotive, printing and display technology.

Description of the Prior Art

Co-pending U.S. application Ser. No. 09/359,004 discloses an apparatus for the implementation of diaphanoscopic examinations employing an illumination unit formed as a monolithic semiconductor laser diode array with separately driveable laser diodes that emit radiation. This array is followed by an optical means in the form of a micro-lens array for influencing the emitted laser beam. The separately driveable laser diodes of this apparatus make it possible to diaphanoscopically examine a specific region of a specific region, for example a knuckle gap, in limited fashion.

German PS 44 18 477, corresponding to U.S. Pat. No. 5,902,997, discloses an optoelectronic assembly with a base part on which an opto-electronic component having a number of driveable laser diodes is fixed, a lens of a lens body being respectively allocated to these diodes. The array is provided with connectors at the carrier side for driving the semiconductor array of diodes.

U.S. Pat. No. 5,327,443 discloses a semiconductor laser device with a semiconductor laser chip that is arranged on a carrier plate, wherein the semiconductor laser chip is surrounded by a frame placed onto the carrier, with a deflection mirror being disposed at the frame via which the emitted laser beam is deflected by approximately 90°. The deflected beam passes through a transparent window that is secured at the frame and covers the laser chip.

German OS 43 07 570, corresponding to U.S. Pat. No. 5,689,521 discloses a semiconductor laser light source unit wherein a rod lens or a cylinder lens for enlarging the divergence angle of the laser beam output by the semiconductor laser is arranged in front of a semiconductor laser in order to generate an essentially circular far field. By appropriate alignment of the laser chip emitting a single laser beam, a laser beam is emitted having an elliptical cross-sectional profile. The cross-sectional profile of the laser beam is circular after passing through the rod lens. A cylinder lens into which a laser beam with elliptical cross-sectional profile enters has the equivalent effect.

PCT Application WO 91/02392 also discloses an integrated micro-system with a laser system together with following optics, wherein the system is arranged on a substrate. An integrated cooling element for cooling the system is also provided.

U.S. Pat. No. 4,803,689 discloses a semiconductor laser module wherein a Peltier element is provided for temperature control.

Further, European Application 0 660 467, discloses an opto-electronic component wherein the laser chip is arranged on a common carrier between two carrier parts whose lateral surfaces neighboring the resonator faces of the laser chip are provided with mirrored layers and are inclined by 45° relative to the resonator faces, so that the mirrored radiation emerges perpendicularly upwardly. The radiation coupled out in this way impinges a lens coupling optics into which it enters nearly perpendicularly.

A laser diode array with a diode laser bar, an electrode and a substrate that are secured to a heat sink form a diode laser unit, as disclosed in U.S. Pat. No. 5,764,675. This diode laser unit is secured to an electrical insulator plate that is in turn arranged at a heat exchanger for the elimination of heat.

Further, German OS 196 05 726 discloses an arrangement for optical coupling of a monitor diode to a laser diode, with both diodes being arranged in succession on a carrier lamella of silicon, separated by a groove. A spherical lens is arranged in the groove for coupling, which collects emitted back light and focuses it at a deflection surface where the light is reflected into the active zone of the monitor diode.

U.S. Pat. No. 5,446,750 discloses a solid state laser module with a laser diode, a solid state laser crystal and a resonator. An electronic cooling arrangement having a cooling surface at which the optical module is arranged is also provided.

A semiconductor laser device with a semiconductor laser chip and a cylinder lens for focusing the laser radiation emitted by the semiconductor laser chip is also disclosed in German OS 197 06 276. The semiconductor laser chip is secured to a base carrier part, and the cylinder lens is arranged lying on the base carrier in front of a beam exit face of the semiconductor laser chip.

German OS 197 06 279 discloses a laser device wherein a body emitting laser radiation and at least one element for beam guidance or for beam imaging are arranged in a common housing. Silicone is employed for fastening the beam guidance or imaging element.

German OS 44 10 888 discloses an arrangement for the transirradiation of human tissue, i.e. a diaphanoscopy arrangement, whereby the tissue is transirradiated with radiation having at least two different wavelengths in a radiation range of 600–1100 nm, and the minimum spacing between the wavelengths amounts to 150 nm. The tissue-specific scattered light generated in the transirradiation is subsequently detected with an image pickup system.

SUMMARY OF THE INVENTION

An object of the present invention is to provide a compactly structured illumination unit that can be versatilely employed, particularly for a diaphanoscopy device.

This object is achieved in accordance with the present invention in an illumination unit having a monolithic semiconductor laser diode bar with separately driveable drivable laser diodes that emit radiation, as well as at least one optical arrangement for collimating and/or focusing the emitted laser beam, the laser diode bar and the optical means being arranged at a common carrier, and wherein the laser diode bar is connected to a pin-like terminal elements at the carrier for diode drive, the pin-like terminal elements being in turn connectable or connected to a terminal arrangement provided at a carrier plate that accepts the carrier, and having a radiation-transparent covering that encapsulates the carrier.

In the inventive illumination unit, all required elements are arranged on a single carrier and are encapsulated with a radiation-transparent covering, so that the individual elements are protected against external influences such as dust, being touched, and the like. The carrier itself, which can inventively be a ceramic carrier, is in turn connectable or connected via pin-like terminal elements, which project laterally therefrom and via which the laser diode array is contacted at the p-side and n-side to a further carrier plate and the terminal arrangement provided thereon. In an embodiment, the carrier can be put in place as a prefabricated component part on a carrier plate of the device, or of the device control, which, for example, can be a printed circuit board. In addition, there is the possibility to connect the carrier to the ceramic carrier plate of a chip housing, i.e. the overall illumination unit can be realized in the form of an illumination chip that is in turn secured on a printed circuit board of the control unit. Overall, the inventive illumination unit represents a small-format, simply mounted and compact unit that, in particular, is well-protected due to the encapsulation.

In order to allow the possibility of a horizontal installation of the illumination unit into the device housing so that this can be kept thin and small overall, in an embodiment the optical arrangement inventively has at least one deflection mirror for deflecting the emitted laser beam. As a result, it is possible to arrange the respective components of the illumination unit, or the carrier itself, in horizontal alignment relative to the apparatus; the vertical outfeed of the laser beam being realized with the deflection mirror. A deflection by 90° is thereby advantageous. The deflection mirror itself should be composed of a ceramic part with a vapor-deposited mirror face.

The laser diode bar or the individual diodes themselves are connected to the pin-like terminal elements with bond wires. Each laser diode thus can be directly connected to a pin-like terminal elements via a bond wire for forming a p-contact. Further, the side of the carrier that accepts the laser diode array can be at least partly covered with an electrically conductive layer, particularly a gold layer, to which the laser diode bar placed on the layer is electrically connected, and that is connected to at least one pin-like terminal means via a bond wire for forming an n-contact for the laser diode bar. As a result, the required p-contacts as well as the at least one n-contact that are required for the separate drive can be produced in a simple way.

In order to be able to implement the illumination units in as stable a fashion as possible, it has proven expedient to provide a laterally closed recess at the carrier in which the laser diode bar and the optical means are arranged, with the radiation-transparent covering being a plate or disk that closes the recess. A recess closed on all sides is provided for the acceptance of the relevant elements at the carrier, which is preferably a multi-layer ceramic carrier, this recess, of course, being deep enough so that the elements can be completely accepted therein. The ceramic carrier offers adequate protection on all sides and is sufficiently stable; the recess itself is then merely closed with the plate-like covering, so that a complete encapsulation is established with a simple design of the carrier as well as the covering.

It has proven especially advantageous for fabrication-related reasons when the optical arrangement is a pre-fabricated component part. The optical arrangement is placed completely on the carrier, which offers a considerable simplification in the assembly. The optical arrangement can be pre-fabricated as a module in this embodiment of the invention, with micro-lens systems for collimation and/or focusing as well as, if used, the deflection mirror, are arranged, for example, on a small, common carrier. The individual elements of the optical arrangement, of course, are matched to the employed laser diode bar, i.e. the succession of micro-lenses of the respective focusing systems and their number as well as the length of the deflection mirror are adapted to the spacing and number of individual laser diodes of the bar as well as to the overall length of the array, the optical arrangement also can be matched to the emitted radiation, etc. This embodiment allows the prefabricated component part to be specifically designed for a laser diode bar, such as a modular system for each laser diode bar employed.

It has proven expedient for the optical arrangement to be fashioned for collimating the emitted laser beam in two axes residing perpendicularly to one another, that in turn reside perpendicular to the beam direction, so as to generate a beam having a generally circular cross-section. This can be realized with two or more successively connected micro-lens arrays and, if necessary, micro-prism arrays that collimate the laser beam in the respectively desired axis. Such lens or prism arrays can be obtained, for example, from LIMO-Lissotschenko Mikrooptik GmbH, Dortmund, Germany.

It has proven advantageous for securing the individual elements to the carrier to secure the laser diode bar and the optical arrangement and possibly the covering as well, to the carrier with a glued connection, preferably upon using a temperature-resistant adhesive. A conductive adhesive is expediently employed for gluing the laser diode bar since the electrical contacting to the gold coating is realized thereby. The covering itself should be composed of glass, particularly anti-reflection coated glass. The laser diode bar can alternatively be secured with a solder connection.

When the laser diode bar is operated with low power <15 mW, the heat that thereby arises is unproblematic and can be eliminated via the carrier. Given higher laser powers in the range between 15 mW–100 mW, this is not always possible, for which reason an arrangement for cooling the carrier is provided at the carrier, particularly in the region of the laser diode bar, in order to avoid an overheating, and thus a premature aging, of the laser diode bar. This cooling arrangement is preferably a Peltier element. This is connected via contact pins to a regulator, so that the cooling capacity can be regulated as needed.

The carrier itself is implemented as a surface mounted device that is secured or can be secured to the carrier plate in a soldering process, preferably a re-flow process.

The invention is also directed to a device for the implementation of diaphanoscopic examinations having an illumination unit of the above-described type.

Further, the illumination unit of the invention can be employed in an apparatus for printing technology, such as character printing technology, particularly written characters and image printing technology, for example offset and rotogravure technology. The inventive illumination unit also can be used in a display means, for example a display, sensor mechanism, particularly for distance-measuring technology and speed-measurement technology and/or automotive technology.

DESCRIPTION OF THE PREFERRED EMBODIMENTS

Figure 1:
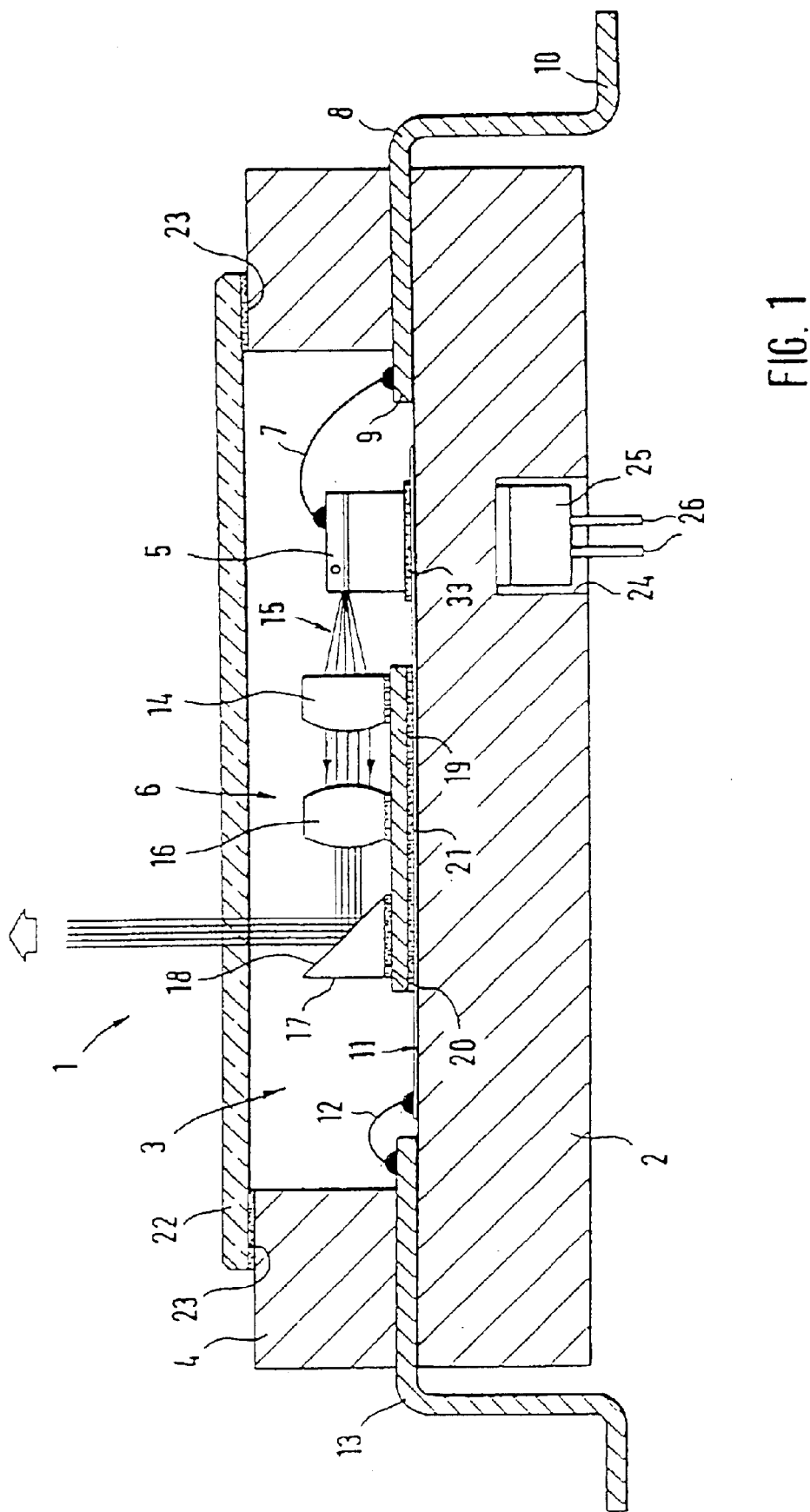
FIG. 1 is a schematic section through an inventive illumination unit.

FIG. 1 shows a first embodiment of an illumination unit 1 having a carrier 2, preferably a multi-layer ceramic carrier, at which a recess 3 is provided that is laterally closed via side walls 4 on all sides. A laser diode array in the form of a laser bar 5 with a number of separately addressable and driveable, individual laser diodes as well as an optical arrangement 6 are accepted in this recess 3. The laser bar 5 is shown in a side (end) view in FIG. 1. The monolithic laser diode bar 5 typically has dimensions of length×width×height=10 mm×0.6 mm×0.115 mm. The spacing of the laser diodes from one another can be between 50 µm through 2000 µm. Lengths of the monolithic laser bar 5 between 1 mm and 30 mm can be technologically realized. Any known material can be employed as semiconductor material; this is based on the desired wavelength. The bandwidth should be extremely narrow and lie in the range of +/−3 nanometers. Due to the monolithic array technology, a uniform radiation power and directional characteristic of all laser diodes is established, so that every diaphanoscopic image a data registration produced on the basis of the emission of one of the laser diodes is comparable to the others. The optical power (cw) should lie between 10 mW and 200 mW per individual laser diode element, whereby the optical power for the medical application should lie in the region of <100 mW/mm$^2$ given a laser beam diameter of <300 µm in the focus. The preferred diameter of a laser beam spot amounts to approximately 150 µm through 200 µm.

Each individual laser diode is connected via a separate bond wire 7 to a pin-like terminal elements 8, this pin-like terminal element 8 being embedded in the multi-layer ceramic carrier 2 so that a terminal pad 9 lies within the recess 3 for securing the bond wire 7. A terminal foot 10 located outside the carrier 2 is provided for contacting the terminal element 8 to a carrier plate, which is not shown in greater detail herein. The p-contacts of every individual laser diode are realized via the bond wires 7.

Figure 3:
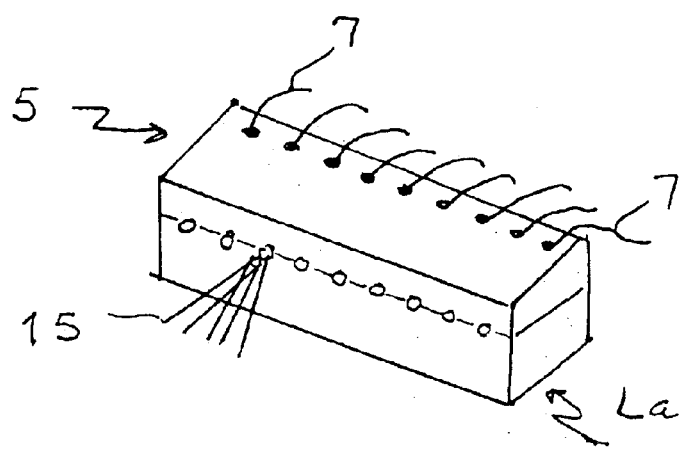
FIG. 3 is a perspective view of the laser bar used in the inventive illumination unit.

The laser bar 5 is shown in perspective view in FIG. 3.

For realizing an n-contact of the laser diodes, first, the recess 3 is occupied with a conductive layer 11, preferably a vapor-deposited gold layer. The laser diode bar 5 is glued onto this conductive layer 11 with a soldered connection or a conductive, temperature-resistant glued connection 33, whereby the adhesive is also preferably temperature-resistant. The conductive layer 11 is in turn connected via on or more bond wires 12 to a further pin-like terminal element 13, which is integrated into the ceramic carrier 2 in a manner corresponding to that of the pin-like terminal element 8.

The optical arrangement 6 is composed of a first micro-lens system 14 for collimating the laser beam 15 shown in FIG. 1 that is emitted by a laser diode, and a second micro-lens system 16 for focusing the laser beam 15. These micro-lens systems 14, 16 are preferably made of glass, and the collimating system can be specifically fashioned such that it collimates in two beam axes. To this end, the micro-lens system 14 can also be composed of a number of separate lens systems connected following one another.

The optical arrangement 6 further includes a deflection mirror 17 composed of a ceramic part vapor-deposited with a mirror surface 18. The laser beam, which has a diameter between 150 µm and 200 µm and has a circular cross-section due to the above-described, two-axis collimating property of the micro-lens system, is deflected by 90° with the deflection mirror 17 and is coupled out. This makes it possible for the carrier 2 can be horizontally installed, so that an apparatus employing the illumination means can be kept small overall.

As FIG. 1 shows, the micro-lens systems 14, 16 as well as the deflection mirror 17 are arranged at an acceptance carrier 19 via corresponding, temperature-resistant glued connections 20, i.e. the optical arrangement 6 represents a single, pre-fabricated component. The acceptance carrier 19 is in turn glued to the carrier 2 via a temperature-resistant glued connection 21.

The recess 3 is in turn closed with a covering 22 composed of anti-reflection coated glass, so that all components lying under it are protected against dust and from being touched. The covering 22, of course, is transparent for the laser emission to be coupled out. Here, too, a glued connection 23 is used for fastening the covering 22.

A further recess 24 that is arranged under the laser diode bar 5 and is provided for the acceptance of an element 25 for cooling the carrier is provided at the carrier 2. The element 25 is preferably a Peltier element. The cooling element 25 can be connected via corresponding terminals 26 to a regulator via which the cooling capacity can be regulated. The employment of a cooling element 25 is expedient, particularly given laser powers >15 mW, since a complete heat elimination via the carrier 2 is then no longer assured and possible temperature elevations can lead to a deterioration of the laser diode array 5. Of course, the terminals 26 can again be fashioned as pin-like terminal elements that exit laterally at the ceramic carrier 2.

The illumination unit 1 described in FIG. 1 represents a compact component part that merely has to be connected to the control means (not shown) for driving the laser diodes. In the simplest case, this can occur by directly applying the carrier 2 in a re-flow soldering process onto a carrier plate, for example a printed circuit board of the control means of the apparatus (not shown) for the implementation of the diaphanoscopic examination. As already set forth, the illumination is a surface mounted device.

Figure 2:
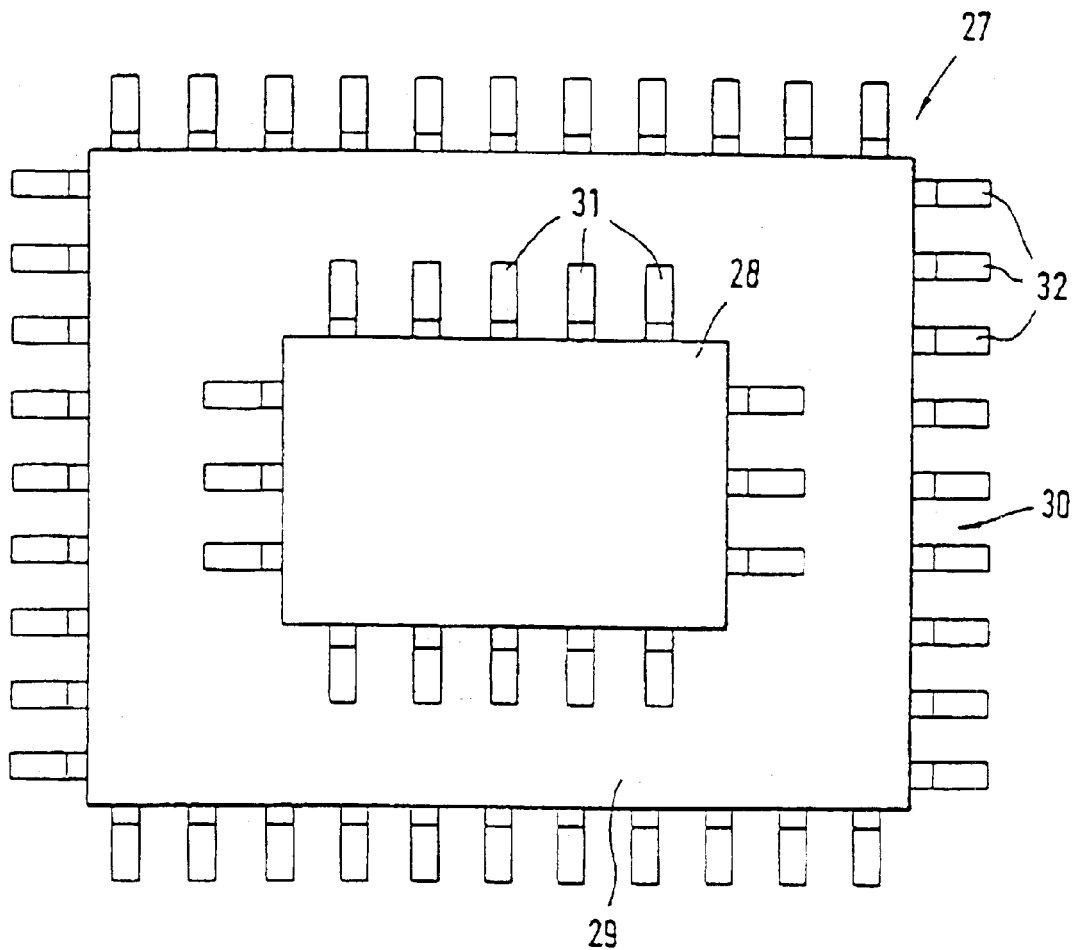
FIG. 2 is a plan view of a further embodiment of an inventive illumination unit that has a chip carrier.

FIG. 2 shows a further embodiment of an illumination unit 27. This has a carrier 28 that is implemented in a corresponding way and contains the same elements as the carrier 2 according to FIG. 1. In this case, however, the carrier 28 is arranged at a carrier plate 29 of a ceramic chip housing 30. The overall illumination unit 27 thus forms an illumination chip that is likewise pre-fabricated. Via interconnects (not shown) on the carrier plate 29, the carrier 28 is connected via its pin-like terminal means 31 to the pin-like terminal means 32 of the chip housing 30. In this case, the contacting of the illumination unit 27 to the control means (not shown) ensues via the pin-like terminal elements 32.

Although modifications and changes may be suggested by those skilled in the art, it is the intention of the inventors to embody within the patent warranted hereon all changes and modification as reasonably and properly come within the scope of their contribution to the art.

We claim as our invention:

1. An illumination unit comprising:
    a monolithic semiconductor laser diode bar containing a plurality of individually driveable laser diodes, each of which emits radiation;
    an optical arrangement for at least one of collimating and focusing said radiation, said optical arrangement having respectively different horizontal and vertical focal lengths for producing a radiation beam having a substantially circular cross-section;
    a common carrier on which said laser diode bar and said optical arrangement are mounted;
    a plurality of pin-like terminal elements at said carrier electrically connected to said laser diode bar for transmitting drive signals to said laser diodes; and
    a covering that is transparent to said radiation and which encapsulates said carrier, and said laser diode bar and said optical arrangement mounted thereon.

2. An illumination unit as claimed in claim 1 wherein said optical arrangement includes at least one deflection mirror for deflecting radiation from said laser diodes through said cover.

3. An illumination unit as claimed in claim 2 wherein said radiation is emitted from said laser diodes in an emission direction, and wherein said deflection mirror deflects said radiation by 90° relative to said emission direction.

4. An illumination unit as claimed in claim 2 wherein said deflection mirror comprises a ceramic component having a vapor-deposited mirrored surface.

5. An illumination unit as claimed in claim 1 comprising a plurality of bond wires electrically connecting said laser diode bar to said pin-like terminal elements.

6. An illumination unit as claimed in claim 5 wherein each of said laser diodes is directly connected to one pin-like element via a respective bond wire for forming a p-contact, and wherein said carrier has an electrically conductive layer at a side of said carrier at which said laser diode array is mounted, said electrically conductive layer being connected to at least one of said pin-like terminal elements via a bond wire and forming an n-contact for said laser diode bar.

7. An illumination unit as claimed in claim 1 wherein said carrier has a laterally closed recess in which said laser diode bar and said optical arrangement are disposed, and wherein said covering comprises a flat element closing said recess.

8. An illumination unit as claimed in claim 1 wherein said optical arrangement comprises pre-fabricated component.

9. An illumination unit as claimed in claim 1 wherein said radiation is emitted by said laser diodes in an emission direction, and wherein said optical arrangement collimates said radiation in two axes disposed perpendicularly to each other and disposed perpendicularly to said emission direction.

10. An illumination unit as claimed in claim 1 wherein said carrier comprises a ceramic carrier formed by multi-layer technology.

11. An illumination unit as claimed in claim 1 wherein said laser diode bar and said optical arrangement are secured to said carrier with a glued connection.

12. An illumination unit as claimed in claim 11 wherein said cover is also secured to said carrier with a glued connection.

13. An illumination unit as claimed in claim 11 wherein said glued connection is comprised of a temperature-resistant adhesive.

14. An illumination unit as claimed in claim 1 wherein said optical arrangement is secured to said carrier with a glued connection and wherein said laser diode bar is secured to said carrier with a soldered connection.

15. An illumination unit as claimed in claim 1 wherein said covering is comprised of glass.

16. An illumination unit as claimed in claim 15 wherein said covering is comprised of anti-reflection coated glass.

17. An illumination unit as claimed in claim 1 further comprising a cooling element in thermal communication with said carrier.

18. An illumination unit as claimed in claim 17 wherein said cooling element is disposed at said carrier at a region of said laser diode bar.

19. An illumination unit as claimed in claim 17 wherein said cooling element comprises a Peltier element.

20. An illumination unit as claimed in claim 1 wherein said carrier comprises a surface mounted device and wherein said illumination unit further comprises a carrier plate securable to said carrier by soldering.

21. An illumination unit as claimed in claim 20 wherein said carrier is securable to said carrier plate with a re-flow process.

22. An illumination unit as claimed in claim 20 further comprising a chip housing containing said carrier, said chip housing being secured to said carrier plate.

* * * * *